(12) United States Patent
Minami et al.

(10) Patent No.: US 9,371,225 B2
(45) Date of Patent: Jun. 21, 2016

(54) SUBSTRATE PROCESSING METHOD

(71) Applicant: CANON KABUSHIKI KAISHA, Tokyo (JP)

(72) Inventors: Seiko Minami, Warabi (JP); Toshiyasu Sakai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/330,662

(22) Filed: Jul. 14, 2014

(65) Prior Publication Data

US 2015/0024605 A1    Jan. 22, 2015

(51) Int. Cl.
*B81C 1/00* (2006.01)
*H01L 21/311* (2006.01)
*H01L 21/3065* (2006.01)

(52) U.S. Cl.
CPC .......... *B81C 1/00587* (2013.01); *B81C 1/00087* (2013.01); *H01L 21/3065* (2013.01); *H01L 21/31116* (2013.01); *B81B 2201/052* (2013.01); *B81C 2201/0132* (2013.01); *H01L 21/30655* (2013.01)

(58) Field of Classification Search
CPC .......... B41J 2/01; B41J 2/1628; B41J 2/1631; B41J 2/1626; B41J 2/14129; H01L 21/3065; H01L 21/31116
See application file for complete search history.

(56) References Cited

U.S. PATENT DOCUMENTS

| 8,012,773 B2 * | 9/2011 | Hayakawa | 438/21 |
| 2009/0065472 A1 * | 3/2009 | Asai et al. | 216/27 |
| 2009/0244198 A1 * | 10/2009 | Hayakawa et al. | 347/63 |
| 2012/0069094 A1 * | 3/2012 | Okano et al. | 347/54 |

FOREIGN PATENT DOCUMENTS

JP    2003-53979 A    2/2003

* cited by examiner

*Primary Examiner* — Duy Deo
(74) *Attorney, Agent, or Firm* — Canon USA Inc. IP Division

(57) ABSTRACT

A substrate processing method for forming a through-hole in a substrate by reactive ion etching includes preparing a substrate that has a first surface and a second surface and on the first surface side of which a first layer and a second layer are disposed, the second surface being on the opposite side to the first surface, the second layer covering the first layer; and performing reactive ion etching on the substrate from the second surface to form a through-hole extending through the substrate from the first surface to the second surface, the reactive ion etching being performed to reach the first layer. The etching rate of the second layer for the reactive ion etching is lower than that of the first layer.

8 Claims, 7 Drawing Sheets

SUBSTRATE PROCESSING METHOD

BACKGROUND OF THE INVENTION

1. Field of the Invention

The present invention relates to a substrate processing method.

2. Description of the Related Art

Examples of a processing method for forming a through-hole in a substrate include a method that uses reactive ion etching, which is a type of dry etching. A substrate processing method that uses reactive ion etching, which is a method of forming a through-hole by using an etching gas, is suitable for forming a vertical through-hole. In particular, reactive ion etching may be used to form a liquid supply port (through-hole) in a substrate of a liquid ejection head, typically an inkjet head. A vertical hole can be easily formed by reactive ion etching. In other words, a through-hole formed by reactive ion etching is not enlarged horizontally. Therefore, the size of a substrate can be reduced.

In order to form a through-hole in a substrate by reactive ion etching, a layer made of an insulator (etching-stop layer) is formed on a first surface side of the substrate, and reactive ion etching is performed from a second surface that is on the opposite side to the first surface, until the reactive ion etching reaches the etching-stop layer. The etching is finished when the etching reaches the first surface and the etching-stop layer. Then, the etching-stop layer is removed, thereby forming a through-hole in the substrate.

With such a substrate processing method, a phenomenon called "notching" may occur when reactive ion etching reaches the etching-stop layer. The term "notching" refers a phenomenon in which a through-hole is enlarged in a direction perpendicular to the direction in which the through-hole is to be formed due to the effect of electric charging. The problem of notching will be explained by using an example in which a liquid supply port (through-hole) is formed in a substrate of a liquid ejection head. After etching of the substrate from the second surface side has reached the etching-stop layer on the first surface side, the etching progresses along the etching-stop layer. In other words, the etching progresses in a direction perpendicular to the direction in which the supply port is to be formed. If notching occurs, the opening of the through-hole on the first surface side is enlarged to an undesirably large size by etching. Referring to FIGS. 7A to 7C, how this occurs will be described in detail. FIGS. 7A to 7C illustrate a process of forming a liquid supply port 6 in a substrate 1.

First, as illustrated in FIG. 7A, the substrate 1 is prepared. The substrate 1 includes an etching mask 9 on a second surface 3 side and an etching-stop layer 11, which is made of an insulator, on a first surface 2 side.

Next, as illustrated in FIG. 7B, reactive ion etching is performed through the opening of the etching mask 9, and the liquid supply port 6 (through-hole) is formed in the substrate 1.

After passing through the substrate 1, the etching reaches the etching-stop layer 11. When etching is continued after reaching the etching-stop layer 11, as illustrated in FIG. 7C, due to the effect of electric charging of the etching-stop layer 11, a notch 14 is formed on the first surface 2 side of the substrate 1 and the etching progresses in a horizontal direction. Depending on the circumstances, the notch 14 may extend to a region in which an energy generating element and wiring for the energy generating element are formed, and the reliability of the liquid ejection head may be reduced.

Japanese Patent Laid-Open No. 2003-53979 describes a method of etching a substrate by alternatingly repeating forming of a protective film and reactive ion etching. With this method, thick protective films are formed on a bottom portion and a side surface of the hole, and only the protective film on the bottom portion is removed by etching. By etching the bottom portion while protecting the side surface with the protective film, notching that occurs at the side surface can be reduced.

SUMMARY OF THE INVENTION

According to an aspect of the present disclosure, a substrate processing method for forming a through-hole in a substrate by reactive ion etching includes preparing a substrate that has a first surface and a second surface and on the first surface side of which a first layer and a second layer are disposed, the second surface being on the opposite side to the first surface, the second layer covering the first layer; and performing reactive ion etching on the substrate from the second surface to form a through-hole extending through the substrate from the first surface to the second surface, the reactive ion etching being performed to reach the first layer. The etching rate of the second layer for the reactive ion etching is lower than that of the first layer.

Further features of the present invention will become apparent from the following description of exemplary embodiments with reference to the attached drawings.

DESCRIPTION OF THE EMBODIMENTS

The inventors examined the method described in Japanese Patent Laid-Open No. 2003-53979, in which a substrate is etched by alternatingly repeating forming of a protective film and reactive ion etching. As a result, the inventors found that, even with this method, as the size of the opening of a through-hole becomes smaller, notching occurs and the size of the opening of the through-hole becomes undesirably large.

The present disclosure provides a substrate processing method with which, even when forming a through-hole having a small opening by reactive ion etching, enlargement of the opening can be suppressed.

Hereinafter, exemplary embodiments of the present invention will be described with reference to the drawings.

Figure 6:
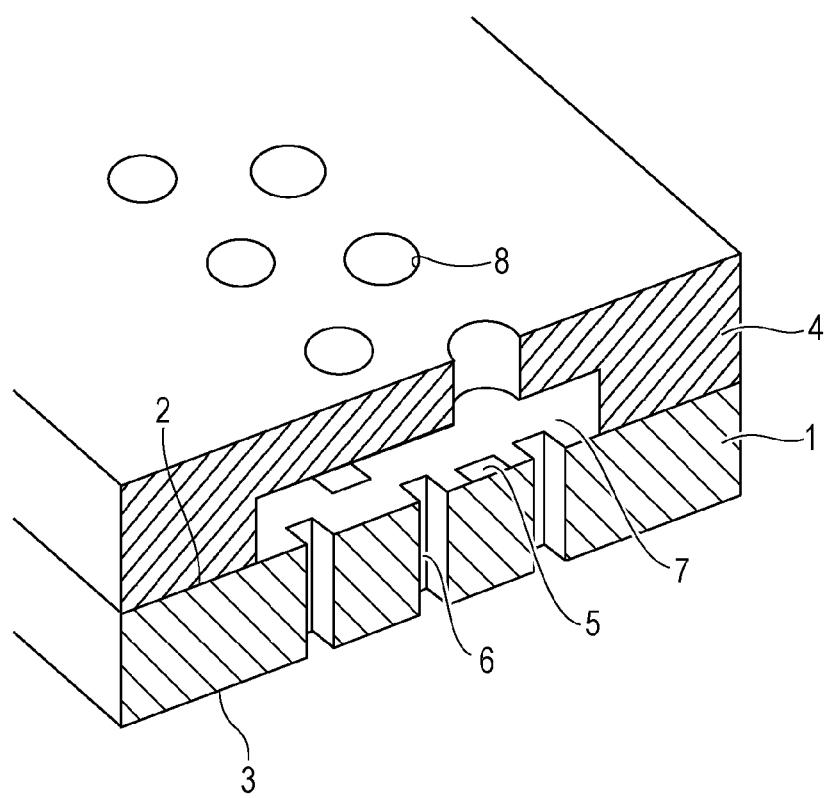
FIG. 6 illustrates an example of a liquid ejection head including a substrate processed by using a method according to the present disclosure.

A substrate processed by using a method according the present invention has a variety of uses. Examples of the uses include a substrate for a liquid ejection head. FIG. 6 illustrates an example of a liquid ejection head including a substrate processed by using a method according to the present invention.

As illustrated in FIG. 6, a member 4 for forming a liquid ejection port 8 is disposed on a first surface 2 side of the substrate 1 of the liquid ejection head. Moreover, an ejection-energy generating element 5 is disposed on the first surface 2 side of the substrate. The ejection-energy generating element 5 may be a heating element, a piezoelectric element, or the like. The ejection-energy generating element 5 may be embedded in the first surface 2 of the substrate, may be in contact with the first surface 2, or may be disposed with a member or a space between the first surface 2 and the ejection-energy generating element 5.

A liquid supply port 6 is formed in the substrate 1. The liquid supply port 6 is a through-hole extending through the substrate 1 from the first surface 2 to a second surface 3 that is on the opposite side to the first surface 2.

The liquid ejection port 8 for ejecting a liquid and a liquid channel 7 through which the liquid flows is formed in the member 4. A liquid is supplied to the liquid channel 7 through the liquid supply port 6, and the ejection-energy generating element 5 provides the liquid with energy to eject the liquid from the liquid ejection port 8.

The substrate 1 is made of, for example, silicon. The substrate 1 may be a silicon substrate whose first surface and second surface have a crystal orientation (100).

The member 4 is made of, for example, a resin. The resin may be a photosensitive resin, and in particular, may be a negative photosensitive resin.

Next, referring to FIG. 1, a substrate processing method according to the present invention will be described.

Figure 1A:
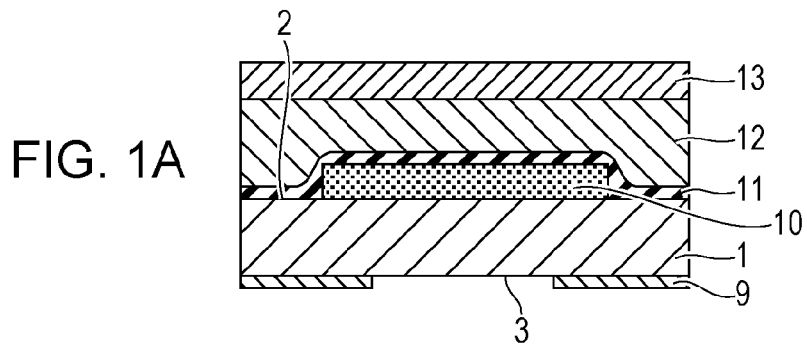
FIGS. 1A to 1E illustrate an example of a substrate processing method.

First, a substrate 1 shown in FIG. 1A is prepared. The substrate 1 is made of, for example, silicon. The substrate 1 has a first surface 2 and a second surface 3 that is on the opposite side to the first surface 2. An etching mask 9 is disposed on the second surface 3 side of the substrate. The etching mask 9 is made of, for example, SiO or a positive photosensitive resin. An opening is formed in the etching mask 9.

Next, a liquid supply port (through-hole) is formed in the substrate 1. The inventors estimate that, when forming a through-hole having a small opening in a substrate, enlargement of the opening occurs for the following reasons. First, as the size of the opening of the through-hole becomes smaller, the aspect ratio of the depth of the through-hole to the size of the opening increases. Positive ions are highly anisotropic and are perpendicularly incident on a surface to be processed. In contrast, electrons have isotropic incidence distribution. As the aspect ratio of a hole to be formed increases, it becomes difficult for electrons to be incident on a bottom surface of the hole to be etched, while positive ions are appropriately incident on the bottom surface. When etching reaches an etching-stop layer, positive ions become accumulated on the surface of the etching-stop layer, and the paths of positive ions to be incident on the surface are bent toward a side wall of the hole. As a result, notching occurs, and the opening of the through-hole is enlarged, even if a protective film has been formed on the side surface of the through-hole.

To prevent this, according to the present invention, a first layer 10 is disposed on the first surface side of the substrate, and a second layer 11 is disposed so as to cover the first layer 10. With such a structure, enlargement of the opening of the through-hole can be suppressed as described below. The etching rate of the second layer 11 for reactive ion etching is lower than that of the first layer 10. In other words, the second layer 11 is an etching-stop layer for reactive ion etching. The second layer 11 forms a side wall that covers a side surface of the first layer 10 and a ceiling that covers an upper surface of the first layer 10.

The first layer 10 may be any layer that can be etched by reactive ion etching. For example, if the substrate is made of silicon, the first layer 10 may also be made of silicon. The first layer 10 may be made of a material that has an etching rate for reactive ion etching higher than that of the substrate. In the case where silicon is used for the substrate, examples of such a material include a positive photosensitive resin, a negative photosensitive resin, a resin including silicon, other general resins, poly-Si (polycrystalline silicon), and P-SiN. A positive photosensitive resin may be used in order to obtain high removability. In a case where the first layer 10 is made of a material having an etching rate lower than that of the substrate, the first layer 10 may be made of an electroconductive material in order to suppress notching.

The second layer 11 may be made of a material having an etching rate for reactive ion etching lower than that of the substrate. Examples of such a material include P-SiO (a silicon oxide formed by plasma vapor deposition), SiN, and the like.

A mold 12, which serves as a mold for forming a liquid channel, is disposed on a side of the second layer farther from the substrate. A member 13 is disposed so as to cover the mold 12. As a result, in a region where the first layer 10 is not present, the substrate, the second layer, the mold, and the member are sequentially arranged in order from the substrate side. In a region where the first layer 10 is present, the substrate, the first layer, the second layer, the mold, and the member are sequentially arranged in order from the substrate side.

When the mold 12 is removed, a space that has been occupied by the mold 12 becomes a liquid channel. The mold 12 is made of, for example, a resin. The resin may be a photosensitive resin, and in particular, may be a positive photosensitive resin in order to obtain high removability. A liquid channel and a liquid ejection port are formed in the member 13. The member 13 may be made of, for example, a resin. The resin may be a photosensitive resin, and in particular, may be a negative photosensitive resin.

Figure 1B:
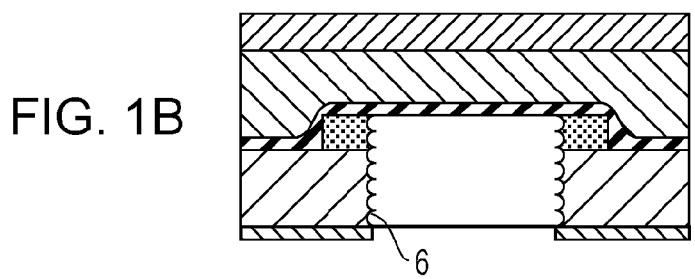

Next, as illustrated in FIG. 1B, reactive ion etching is performed on the substrate to form a liquid supply port 6 (through-hole) in the substrate. Reactive ion etching is performed through the opening in the etching mask 9, which is on the second surface side of the substrate. By performing reactive ion etching from the second surface, a hole is gradually formed in the substrate, and finally a through-hole extending through the substrate from the first surface to the second surface is formed. Then, the reactive ion etching reaches the first layer 10. The etching may be continuously performed after reaching the first layer 10. The first layer 10 is etched by reactive ion etching, the etching progresses in the first layer 10, and subsequently the reactive ion etching reaches the second layer.

Reactive ion etching is an etching method in which an etching gas is ionized to form plasma, and ions and radicals are made to collide with an object to be etched by applying a high-frequency voltage to a cathode on which the object to be etched is disposed. A reactive ion etching method used in the present invention may be a so-called Bosch process, in which etching using $SF_6$ and deposition using $C_4F_8$ are alternatingly repeated.

Figure 7A:
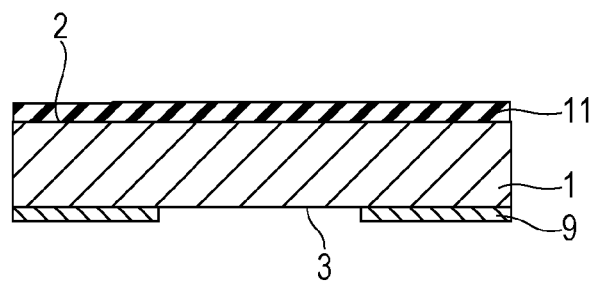
FIGS. 7A to 7C illustrate an existing substrate processing method.
Figure 7B:
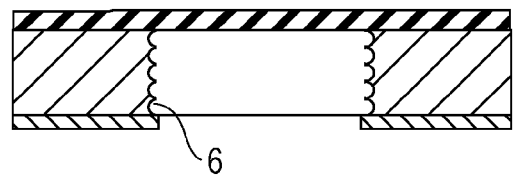
Figure 7C:
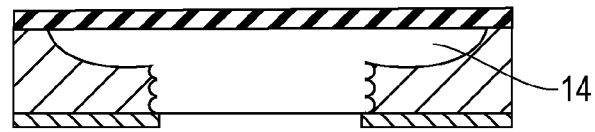

Typically, when a substrate is processed by using the method illustrated in FIGS. 7A to 7C, the size of a notch formed by reactive ion etching (the size of a region that is etched due to notching) is about 0.7 μm in a direction parallel to the first surface of the substrate (horizontal direction) and about 0.2 μm in a direction perpendicular to the first surface of the substrate (vertical direction). With consideration of this data, the size of the first layer may be about the same as or larger than that of a notch. In other words, when the substrate is seen in a direction facing the first surface, the first layer may have such a size that the first layer covers a through-hole (liquid supply port) to be formed. The first layer may have such a size that the first layer extends beyond an edge of the liquid supply port, which is a through-hole to be formed, by a distance of 0.7 μm or greater to each side in a horizontal direction. Although there is no particular upper limit on this distance, the upper limit may be 20.0 μm or less for reasons of manufacturing and arrangement. The length of the first layer in the vertical direction may be 0.5 μm or greater. Although there is no particular upper limit on this length, the upper limit may be 20.0 μm or less for reasons of manufacturing and arrangement.

Figure 1C:
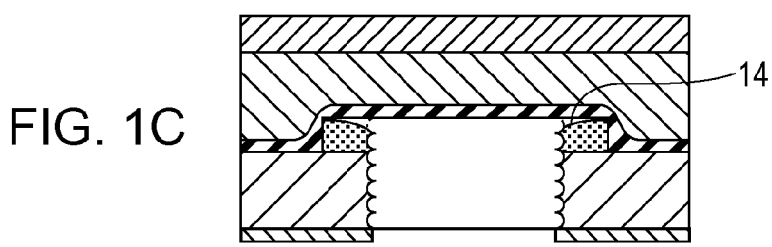

According to the present invention, the second layer 11 is formed so as to cover the first layer 10. Etching reaches the ceiling of the second layer 11 that covers the upper surface of the first layer. As illustrated in FIG. 1C, when reactive ion etching is continued after the etching has reached the ceiling, a notch 14 is formed in the first layer 10 due to the effect of electric charging of the second layer 11.

However, according to the present invention, the first layer 10 and the second layer 11 serve to suppress enlargement of the opening of the through-hole due to notching. Because of the presence of the first layer 10, etching of the first layer 10 progresses faster than etching of the substrate 1, and therefore notching occurs in the first layer 10. In other words, occurrence of notching in the substrate 1 can be suppressed.

If the first layer 10 is not formed and the second layer 11 is formed so as to extend in a direction parallel to the first surface of the substrate, notching tends to occur in the substrate as illustrated in FIGS. 7A to 7C. If the first layer 10 is not formed and the second layer 11 is formed as illustrated in FIGS. 1A to 1E, that is, a cavity is formed instead of the first layer 10, soon after etching has reached the second surface of the substrate, the etching gas starts etching the substrate from the second surface side, and, as a result, horizontal extension of the opening similar to notching occurs. In contrast, according to the present invention, due to the presence of the first layer 10, etching is appropriately controlled because the etching gas etches the first layer, and therefore horizontal extension of the opening similar to notching can be suppressed.

The degree of notching varies depending on the etching time. According to the present invention, even if the etching time is increased, enlargement of notching, and, in particular, enlargement of notching beyond the first layer 10 can be suppressed.

Figure 1D:
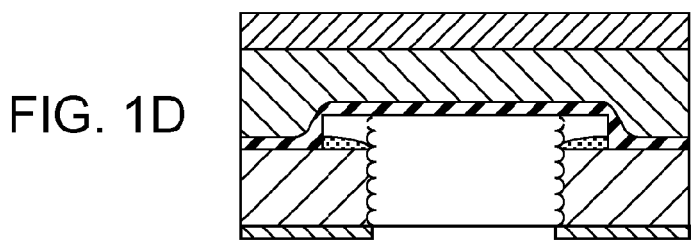

Reactive ion etching reaches the ceiling of the second layer that covers the upper surface of the first layer. Etching may be stopped as soon as the etching reaches the ceiling. However, according to the present invention, reactive ion etching may be continued further to extend the notch 14 to a side wall of the first layer 10, which is covered by the second layer 11. In other words, etching may be performed until the etching reaches the second layer, which serves as a side wall of the first layer. FIGS. 1C and 1D show a state in which the notch 14 has extended to the second layer, which serves as a side wall of the first layer 10. By doing so, the first layer can be removed more easily.

Figure 1E:
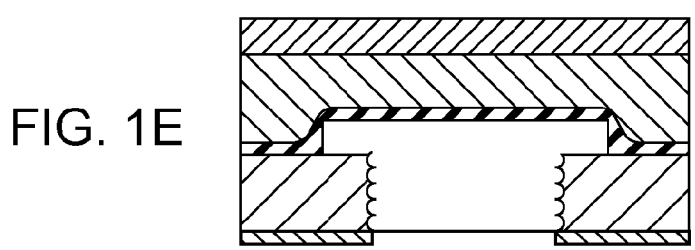

Next, as necessary, isotropic dry etching (CDE) is performed to remove the remaining portions of the first layer as illustrated in FIG. 1E.

Figure 2:
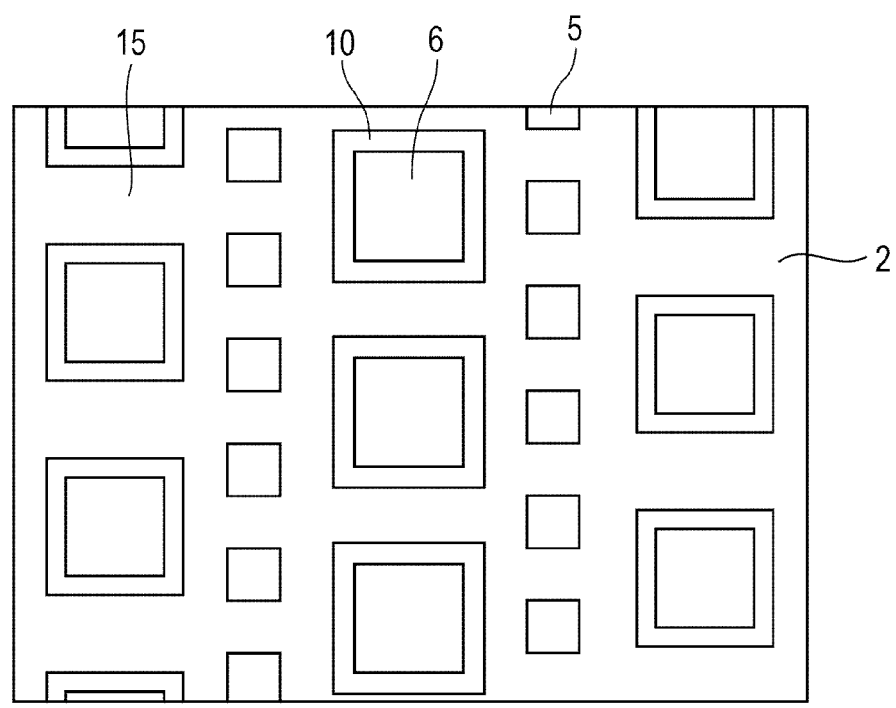
FIG. 2 illustrates an example of a substrate that is processed by using a method.

FIG. 2 illustrates a substrate seen from the first surface 2 side before a liquid supply port is formed. In the exemplary embodiment illustrated in FIG. 2, liquid supply ports 6 are formed on both sides of an ejection-energy generating element 5, and liquid is supplied to the ejection-energy generating element 5 from the both sides.

As illustrated in FIG. 2, the first layer 10 is formed so as to cover a region in which a liquid supply port 6 is to be formed. A second layer (not shown) is formed so as to cover the first layer 10. According to the present invention, the second layer and the first layer serve to suppress enlargement of the opening.

In order to increase the reliability of a liquid ejection head, it is particularly necessary to suppress notching in a direction from the liquid supply port 6 toward the ejection-energy generating element 5. When wiring (not shown) for supplying electric power to the ejection energy generating element is formed on a beam 15 illustrated in FIG. 2, it is also necessary to suppress notching in a direction toward the beam 15. For such purposes, as illustrated in FIG. 2, the first layer 10 may be formed so as to cover the through-hole (liquid supply port) 6 when the substrate is seen in a direction facing the first surface.

EXAMPLES

Hereinafter, the present invention will be explained by using Examples.

Example 1

Figure 3A:
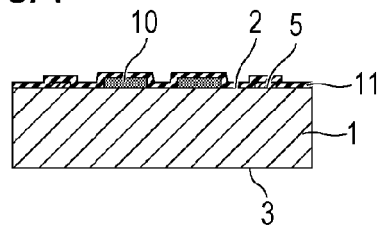
FIGS. 3A to 3J illustrate an example of a substrate processing method.

First, a substrate 1 illustrated FIG. 3A was prepared. A silicon substrate having a thickness of 200 μm was used as the substrate 1. The substrate 1 had a first surface 2 and a second surface 3 that is on the opposite side to the first surface 2. The crystal orientation of the first surface and the second surface was (100).

An ejection-energy generating element 5 made of TaSiN was disposed on the first surface side. A first layer 10 was formed on the first surface side at a position at which an opening of a liquid supply port (through-hole) was to be formed. The first layer 10 was formed by applying a positive photosensitive resin (made by Tokyo Ohka Kogyo, trade name: ODUR) to the first surface 2 of the substrate 1, exposing the positive photosensitive resin to light, and dry-etching the positive photosensitive resin by using a CDE method. The first layer was formed so as to have a size of 30.0 μm×30.0 μm in the horizontal direction and 0.5 μm in the vertical direction. A liquid supply port to be formed later had a size of 27.0 μm×27.0 μm in the horizontal direction. Therefore, the first layer was larger than the liquid supply port by 1.5 μm on one side in a horizontal direction.

Moreover, the second layer 11 was formed. The second layer 11 was formed by depositing P-SiO by plasma CVD so as to form a layer having a thickness of 0.7 μm and so as to cover the first layer 10.

Figure 3F:
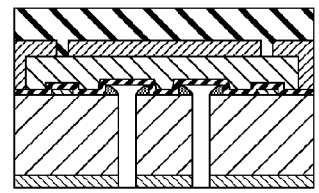
Figure 3B:
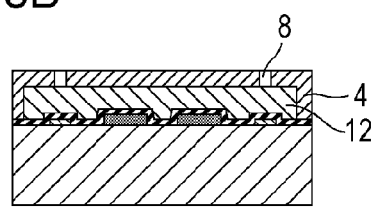

Next, as illustrated in FIG. 3B, a mold 12 was formed on the first surface side of the substrate. The mold 12 was formed by applying a positive photosensitive resin (made by Tokyo Ohka Kogyo, trade name: ODUR) to the first surface side of the substrate, and performing patterning by exposing the positive photosensitive resin to light and developing the positive photosensitive resin. The thickness of the mold was 8.0 μm. Next, a member 4 having a liquid ejection port 8 was formed by applying a negative photosensitive resin (made by Daicel Corporation, trade name: EHPE-3150) to the mold so as to cover the mold by spin coating, exposing the negative photosensitive resin to light, and developing the negative photosensitive resin. The thickness of the member 4 (the thickness of a portion of the member 4 on the mold) was 10.0 μm.

Figure 3G:
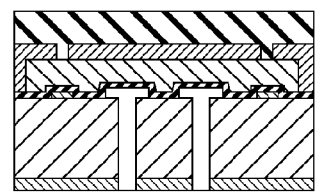
Figure 3C:
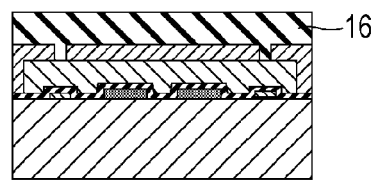

Next, as illustrated in FIG. 3C, a protective resist 16, which serves as a protective film when forming a liquid supply port, was formed. A cyclized rubber (made by Tokyo Ohka Kogyo, trade name: OBC) was used as the protective resist 16.

Figure 3H:
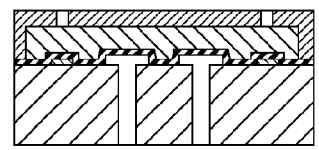
Figure 3D:
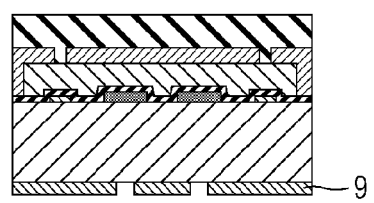

Next, as illustrated in FIG. 3D, an etching mask 9 was formed on the second surface side of the substrate. The etching mask 9, which had an opening, was made by exposing a positive photosensitive resin (made by Tokyo Ohka Kogyo, trade name: OFPR) to light and developing the positive photosensitive resin.

Figure 3I:
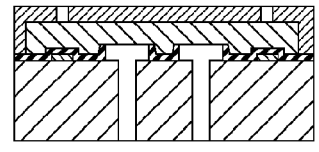
Figure 3E:
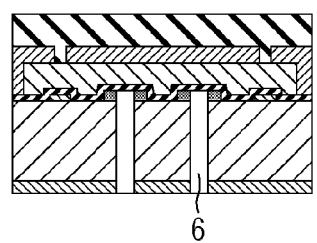

Next, as illustrated in FIG. 3E, reactive ion etching was performed through the opening of the etching mask to form a liquid supply port 6 (through-hole) in the substrate. The reactive ion etching was a Bosch process using an ICP etching apparatus (made by Alcatel, model number: 8E). Until the middle of the reactive ion etching, as illustrated FIG. 3E, the liquid supply port was formed so as to extend substantially perpendicular to the second surface, and etching was performed to reach the first layer 10.

Further, etching was continued to reach a portion of the second layer 11 that forms the ceiling of the first layer 10. Subsequently, as illustrated in FIG. 3F, etching progressed in the horizontal direction to reach a portion of the second layer 11 that forms a side wall of the first layer 10.

Next, as illustrated FIG. 3G, the remaining portions of the first layer 10 were removed by isotropic dry etching (CDE).

Next, as illustrated FIG. 3H, the etching mask 9 and the protective resist 16 were removed. As illustrated FIG. 3I, the second layer 11 was removed by BHF.

Figure 3J:
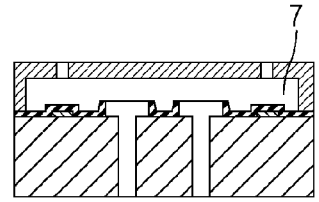

Next, as illustrated FIG. 3J, a liquid channel 7 was formed by removing the mold 12 with an etchant. As a result, the openings of the liquid supply port (through-hole) on the first surface side and the second surface side had about the same size, which shows that enlargement of the opening on the first surface side was suppressed.

Example 2

Figure 4A:
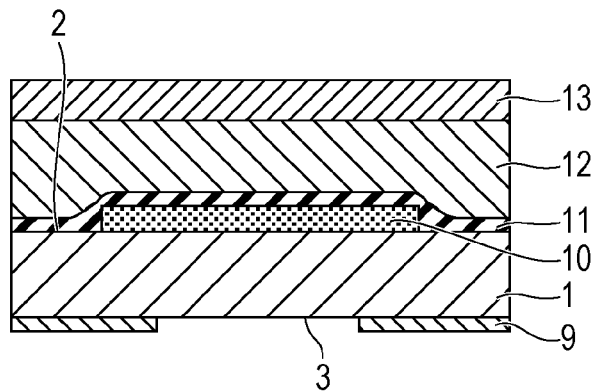
FIGS. 4A to 4C illustrate an example of a substrate processing method.
Figure 4B:
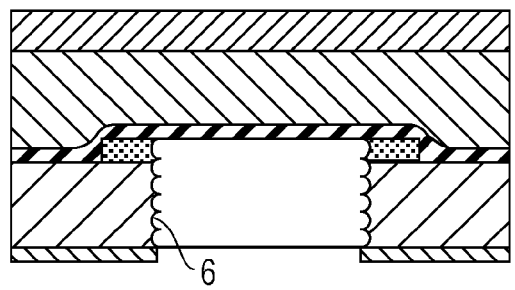
Figure 4C:
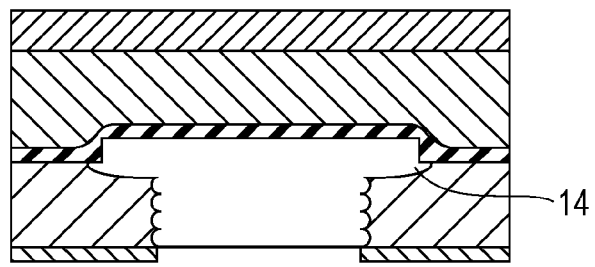

In Example 1, the first layer was formed so as to have a size of 30.0 μm×30.0 μm in the horizontal direction and 0.5 μm in the vertical direction. In contrast, in Example 2, the first layer was formed so as to have a size of 30.0 μm×30.0 μm in the horizontal direction and 0.1 μm in the vertical direction. The size of the second layer, which covers the first layer, was changed accordingly. In other respects, a substrate was processed under the conditions the same as those of Example 1. FIGS. 4A to 4C illustrate this process.

As a result, as illustrated in FIG. 4C, occurrence of notching was suppressed. However, the opening of the liquid supply port on the first surface side was enlarged slightly in the horizontal direction as compared with that of Example 1.

Example 3

Figure 5A:
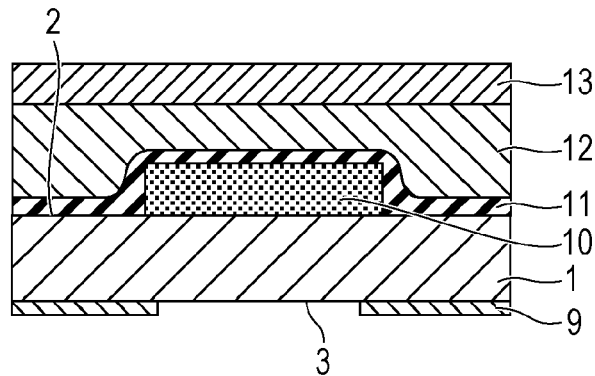
FIGS. 5A to 5C illustrate an example of a substrate processing method.
Figure 5B:
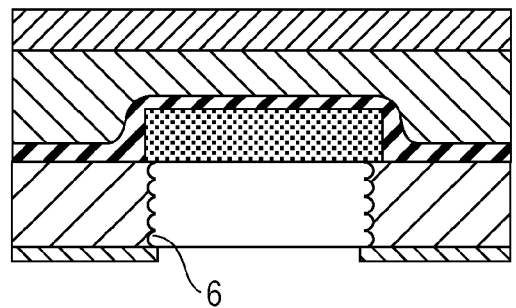
Figure 5C:
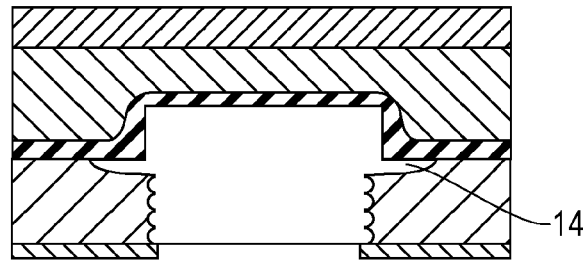

In Example 1, the first layer was formed so as to have a size of 30.0 μm×30.0 μm in the horizontal direction and 0.5 μm in the vertical direction. In contrast, in Example 3, the first layer was formed so as to have a size of 27.6 μm×27.6 μm in the horizontal direction and 0.5 μm in the vertical direction. The size of the second layer, which covers the first layer, was changed accordingly. In other respects, a substrate was processed under the conditions the same as those of Example 1. FIGS. 5A to 5C illustrate this process.

As a result, as illustrated in FIG. 5C, occurrence of notching was suppressed. However, the opening of the liquid supply port on the first surface side was enlarged slightly in the horizontal direction as compared with that of Example 1.

Comparative Example 1

In Example 1, the first layer was formed. In contrast, the first layer was not formed in Comparative Example 1. In other respects, a substrate was processed under the conditions the same as those of Example 1.

As a result, as compared with Example 1, the opening of the liquid supply port on the first surface side was enlarged in the horizontal direction as compared with that of Example 1.

Comparative Example 2

The second layer formed in Comparative Example 1 was formed on the first surface of the substrate so as to extend along the first surface. In other words, the second layer was formed so as to extend parallel to the first surface of the substrate.

As a result, the opening of the liquid supply port on the first surface side was enlarged in the horizontal direction as compared with that of Example 1.

The present invention can provide a substrate processing method with which, even when forming a through-hole having a small opening by reactive ion etching, enlargement of the opening can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-148763, filed Jul. 17, 2013, which is hereby incorporated by reference herein in its entirety.

What is claimed is:

1. A substrate processing method for forming a through-hole in a substrate by reactive ion etching, the method comprising:
preparing a substrate that has a first surface and a second surface and on the first surface side of which a first layer and a second layer are disposed, the second layer forming a side wall that covers a side surface of the first layer and a ceiling that covers an upper surface of the first layer; and
performing reactive on etching on the substrate from the second surface to form a through-hole extending through the substrate from the first surface to the second surface, the reactive on etching being performed to reach the first layer; defining, as a vertical direction, a direction perpendicular to the first surface of the substrate, a length of the first layer in the vertical direction being 0.5 um or greater; and defining, as a horizontal direction, a direction parallel to the first surface of the substrate, the first layer having such a size that the first layer extends beyond an edge of the through-hole formed by a distance of 0.7 m or greater to each side in the horizontal direction.
wherein the first layer is made of one of poly-Si and P—SiN,
wherein an etching rate of the second layer for the reactive on etching is less than that of the first layer, and wherein the reactive on etching is performed to reach the ceiling of the second layer.

2. The substrate processing method according to claim 1, wherein the etching rate of the second layer for the reactive ion etching is less than that of the substrate.

3. The substrate processing method according to claim 1, wherein the second layer is made of P—SiO or SiN.

4. The substrate processing method according to claim 1, wherein the reactive ion etching is a Bosch process.

5. The substrate processing method according to claim 1, wherein the first layer has such a size that the first layer covers a through-hole to be formed when the substrate is seen in a direction facing the first surface.

6. The substrate processing method according to claim 1, wherein the substrate is made of silicon.

7. The substrate processing method according to claim 1, wherein the reactive ion etching is performed to reach the side wall after the reactive ion etching has reached the ceiling.

8. The substrate processing method according to claim 1, wherein the first layer is made of an electroconductive material having an etching rate for the reactive ion etching lower than that of the substrate.

\* \* \* \* \*